US006803857B1

(12) United States Patent
Uehara et al.

(10) Patent No.: US 6,803,857 B1
(45) Date of Patent: Oct. 12, 2004

(54) REMOTE CONTROL SYSTEM

(75) Inventors: Daisuke Uehara, Higashiosaka (JP); Kazuhiko Nakamura, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 357 days.

(21) Appl. No.: 09/598,921

(22) Filed: Jun. 22, 2000

(30) Foreign Application Priority Data

Jun. 25, 1999 (JP) .......................................... 11-180313

(51) Int. Cl.[7] .......................... H04Q 1/00; H03K 17/94; G06F 13/38; G06F 13/00; G06F 13/20

(52) U.S. Cl. ........................... 340/825.56; 340/825.25; 710/67; 710/100; 710/313; 341/26

(58) Field of Search ............................ 340/825.56, 3.1, 340/37.1, 825.25, 825.24, 825.22; 710/100, 313, 67; 341/26

(56) References Cited

U.S. PATENT DOCUMENTS 4,896,290 A * 1/1990 Rhodes et al. ................ 710/67
5,406,273 A * 4/1995 Nishida et al. ........ 340/825.51
5,479,385 A * 12/1995 Hoekstra ................. 369/24.01
5,488,357 A * 1/1996 Sato et al. ............. 340/825.25
5,625,350 A * 4/1997 Fukatsu et al. ........ 340/825.25
6,255,961 B1 * 7/2001 Van Ryzin et al. ......... 257/321

FOREIGN PATENT DOCUMENTS

EP 579354 A2 * 1/1994 ......... G05B/19/417

* cited by examiner

*Primary Examiner*—Brian Zimmerman
*Assistant Examiner*—Clara Yang
(74) *Attorney, Agent, or Firm*—Arent Fox PLLC

(57) ABSTRACT

A controller has means responsive to a continuous press of a continuously operable key to transmit, to an electronic device, a key command indicative of a type of the pressed key, and means for transmitting, to the electronic device, a continuous-key-press command at first time intervals of a predetermined length while the key is kept pressed.

4 Claims, 4 Drawing Sheets

REMOTE CONTROL SYSTEM

BACKGROUND OF THE INVENTION

The present invention relates to a remote control system.

PRIOR ART

There has been known to the art a security system having a plurality of security devices interconnected via, for example, a communication control wire (bus) complying with a standard such as RS-485 (EIA-185 Standards). Examples of the security device include a surveillance camera, VTR for recording images picked up by the surveillance camera, frame switcher and the like. Each of the security devices is assigned a specific address for discrimination from the other security devices on the bus. The address setting is done, for example, by means of a DIP switch assembly provided at each security device.

The bus with the security devices connected thereto is connected to a controller for remote control of the security devices or for centralized management of conditions of the security devices. For instance, a remote control of a VTR having address "1" is done by transmitting a command containing the address "1" of the VTR and a control content such as "PLAY" or "EJECT".

In the controller with keys for remotely controlling the security devices, two types of key operations are available which include "single key press" and "continuous key press". Most remote controls can be done only using information corresponding the single press of any of the keys. However, some controllers are adapted to cause a continuous operation of the security device using information corresponding to a continuously pressed key, such as ZOOM WIDE key and CURSOR key for the surveillance camera. Such keys are referred to as "continuously operable keys".

A command corresponding to a continuous press of a continuously operable key may be delivered by, for example, continuous transmission of a key command of the key kept pressed.

Unfortunately, such a command delivery may cause a busy bus condition during the period of the continuous key press. Thus, the controller becomes incapable of controlling other devices or receiving information from other devices.

SUMMARY OF THE INVENTION

In view of the foregoing, it is an object of the invention to provide a remote control system capable of transmitting information indicative of the continuous press of the continuously operable key to electronic devices without occupying the bus.

A remote control system according to the invention comprises an electronic device and a controller connected to the electronic device via a bus for remotely controlling the electronic device, the controller provided with keys including a continuously operable key to be kept pressed for causing the electronic device to perform a predetermined operation continuously, the controller having means responsive to a continuous press of the continuously operable key to transmit, to the electronic device, a key command indicative of a type of the pressed key, and means for transmitting a continuous-key-press command to the electronic device at first time intervals of a predetermined length while the key is kept pressed, the electronic device having means which determines the key of the type corresponding to the key command to be kept pressed if, after receipt of the key command, the continuous-key-press command is received at some time point between lapses of the first time period and a second time period longer than the first time period, and then triggers a continuous-key-press control operation associated with the continuous-key-press command, and means which, at each receipt of the continuous-key-press command, determines whether or not the next continuous-key-press command is transmitted within the second time period after receipt of the latest continuous-key-press command and terminates the continuous-key-press control operation if the next continuous-key-press command is not transmitted within the second time period after receipt of the latest continuous-key-press command.

It is preferred that the controller has means responsive to release of the continuously operable key having been kept pressed thereby transmitting a release command indicative of the key release to the electronic device, and that the electronic device has means responsive to the release command to terminate the continuous-key-press control operation.

In a case where two or more controllers are connected to the bus, it is preferred that the electronic device has means which, when the electronic device responds to a continuous-key-press command from one of the controllers to perform a continuous-key-press control operation, nullifies a key command or continuous-key-press command from (any of) the other controller(s)

DETAILED DESCRIPTION OF PREFERRED EMBODIMENT

Now, a security system embodying the invention in a preferred mode will be described with reference to the accompanying drawings.

Figure 1:
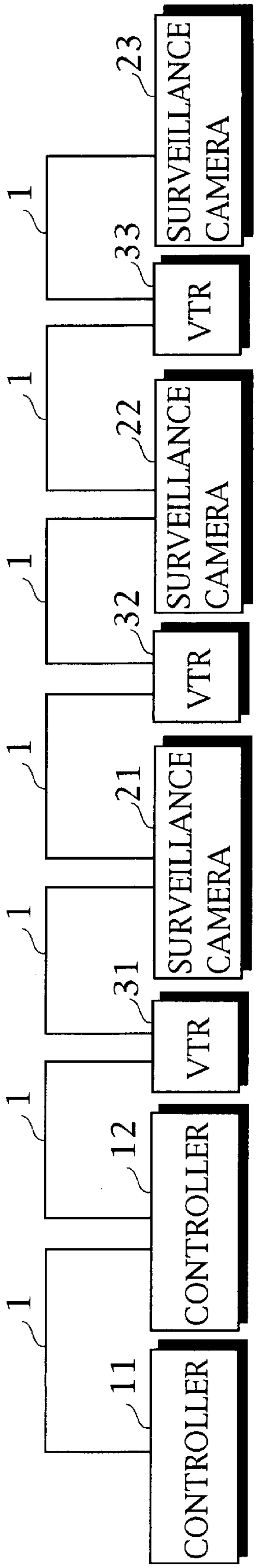
FIG. 1 is a block diagram showing an arrangement of a security system.

FIG. 1 shows an arrangement of the security system. The security system includes two controllers 11, 12; three surveillance cameras 21, 22, 23; and three VTRs 31, 32, 33 for recording images picked up by the surveillance cameras 21, 22, 23. The devices are daisy-chained via an RS-485 communications control wire (bus) 1.

The concept of the invention will be described by way of example where the controller 11 (or 12) transmits information to the surveillance camera, indicating a continuous press of ZOOM WIDE key on the controller.

In order to prevent the bus 1 from being occupied during the continuous press of ZOOM WIDE key, an arrangement may be made such that while ZOOM WIDE key is kept pressed, a key command is transmitted at given time intervals, such as of 500 ms, rather than transmitted continuously. The surveillance camera, in turn, will determine that the key is kept pressed if the same key command as the previous one is supplied thereto within 500 ms of the receipt of the previous one.

The transmission method, however, involves fear that the surveillance camera may erroneously determine that the key commands corresponding to single presses of ZOOM WIDE key at time intervals of less than 500 ms indicate a continuous press of ZOOM WIDE key.

The invention overcomes this problem by transmitting a continuous-key-press command (at 1 Fh, for example) indicative of the continuous key press. The continuous-key-press command is different from an initially transmitted key command and transmitted subsequent to the initial key command at given time intervals (500 ms). Upon receipt of a key command, the surveillance camera recognizes it as the single key press. When receiving a continuous-key-press command within 500 ms of receipt of the key command, the surveillance camera determines that a key represented by the key command prior to the continuous-key-press command is kept pressed. When receiving the next continuous-key-press command within 500 ms of receipt of the continuous-key-press command, the surveillance camera determines that the currently recognized key is still kept pressed.

When multiple devices communicate over the bus 1 at a time, there may occur bus collision. In this event, the communication is placed on hold according to a protocol and then restarted. In the case of the continuous key press, therefore, it is possible that the time interval between two successive continuous-key-press commands is extended from 500 ms to 700 ms. Accordingly, it is preferred that the camera is adapted to determine the continuous key press to be continued if the next continuous-key-press command is received somewhere between lapses of 500 ms and a period longer than 500 ms (e.g., 750 ms).

However, this arrangement involves the possibility of increasing lag between time when the continuous key press is actually terminated (when the key is released) and time when the camera determines the end of the continuous key press because the camera determines the end of the continuous key press depending upon whether or not the next continuous-key-press command comes after the lapse of 750 ms from receipt of the latest continuous-key-press command. Hence, it is preferred that the controller is adapted to transmit a command (hereinafter referred to as "continuous-key-press release command" such as at 1 Eh) indicating that a continuously pressed key is released. Upon receipt of the continuous-key-press release command, the camera determines the end of the continuous key press and terminates the control operation.

Figure 2:
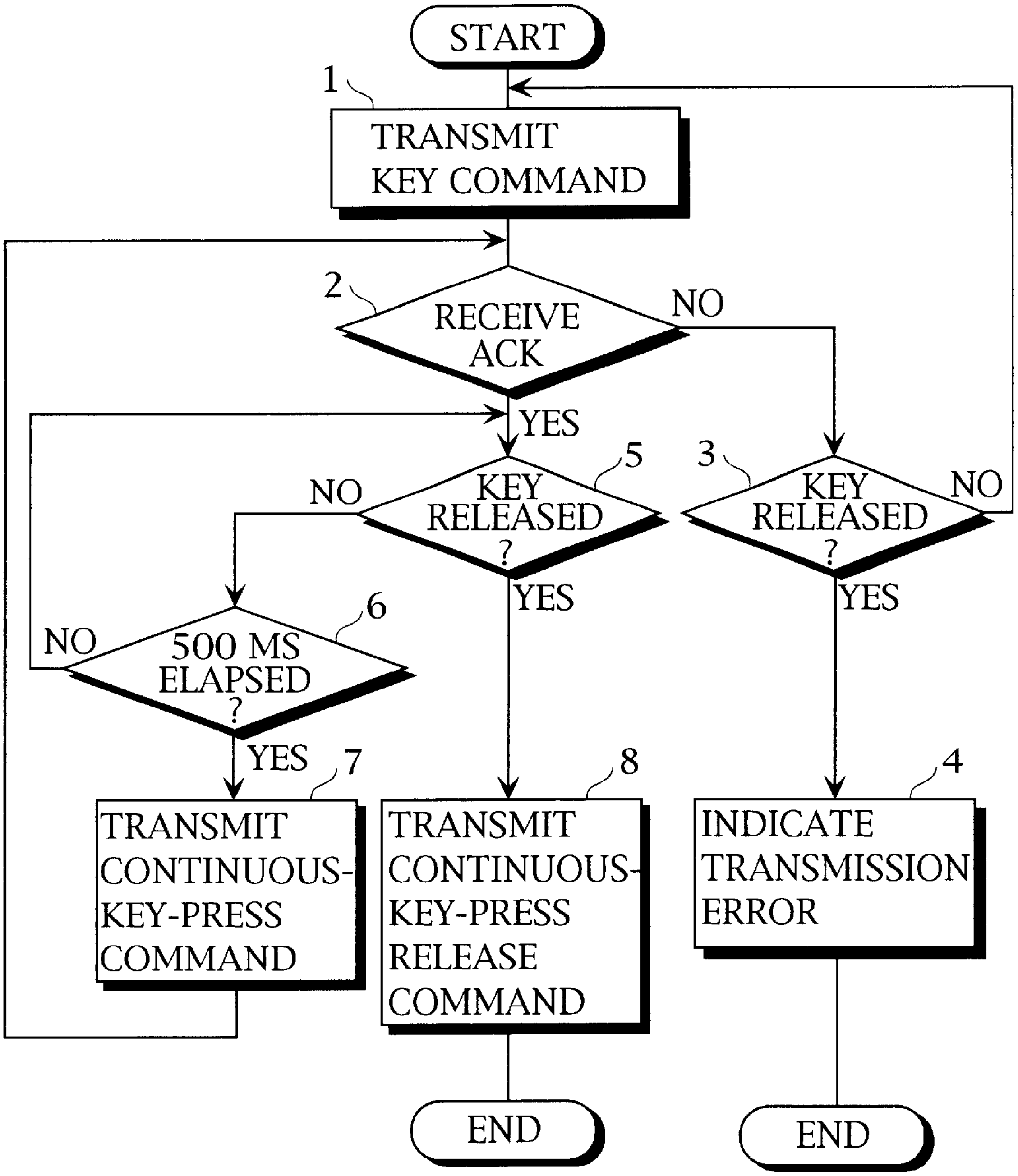
FIG. 2 is a flow chart showing a command transmission procedure taken by a controller responding to a press of a continuously operable key.

FIG. 2 illustrates a command transmission procedure taken by the controller responding to the press of a continuously operable key.

When a continuously operable key of a controller is pressed, a key command corresponding to the pressed key is transmitted along with an address of the controller and an address of a device to be remotely controlled (hereinafter simply referred to as "receive-side device") (Step 1).

At receipt of the command from the controller, the receive-side device returns to the controller a command indicating the command reception (ACK).

The controller waits for the ACK sent from the receive-side device (Step 2). If the controller does not receive the ACK within a given period of time, the controller determines whether the key is released or not (Step 3). If the key is released, the controller causes a display unit to indicate an abnormal command transmission (occurrence of transmission error) (Step 4) and terminates the present transmission process. If it is determined at Step 3 that the key is not released, the control flow returns to Step 1 to transmit the key command again.

If the controller receives the ACK within the given period of time (Step 2) after transmitting the key command at Step 1, the controller determines whether the key is released or not (Step 5). If the key is unreleased for 500 ms after receipt of the ACK at Step 2 ("YES" at Step 6), the controller transmits a continuous-key-press command along with the address of the controller and that of the receive-side device (Step 7). However, in a case where bus collision is likely to occur, the controller stands by according to the protocol and then is allowed to transmit the continuous-key-press command.

After transmission of the continuous-key-press command, the control flow returns to Step 2. While the key is kept pressed, Steps 2 and 5 to 7 are repeated in cycles so that the continuous-key-press command is transmitted at given time intervals.

If it is determined at Step 5 that the key is released, the controller transmits a continuous-key-press release command along with the addresses of the controller and the receive-side device (Step 8) and then, terminates the present process.

Figure 3:
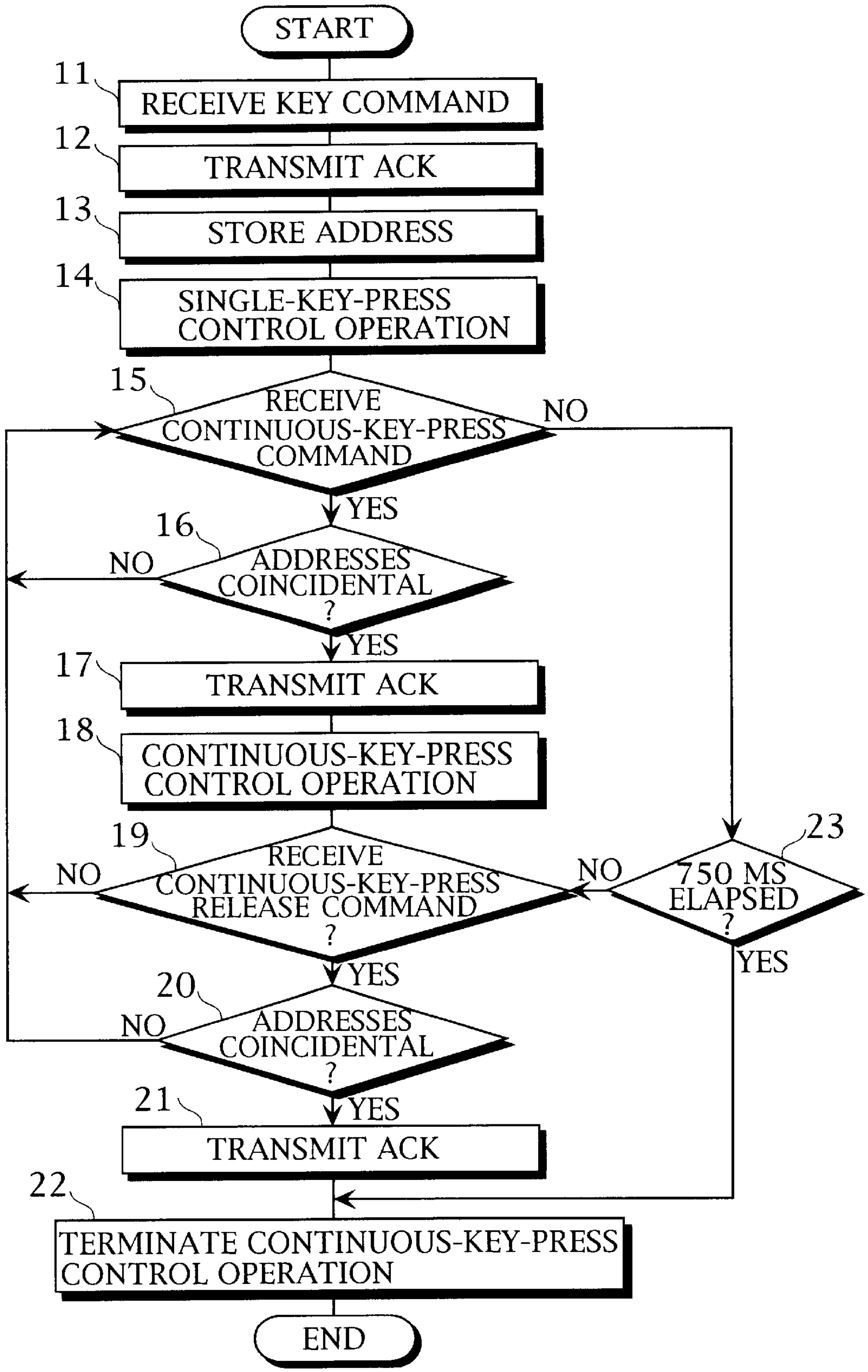
FIG. 3 is a flow chart showing a command reception procedure taken by a receive-side device receiving a key command corresponding to the continuously operable key.

FIG. 3 illustrates a reception procedure taken by the receive-side device receiving a key command corresponding to a continuously operable key.

When receiving a key command (Step 11), the device returns an ACK to a controller (hereinafter, referred to as "send-side device") from which the key command is transmitted (Step 12), while storing an address of the send-side device (Step 13).

Then, a control operation (single-key-press control operation) is performed based on the single press of the key corresponding to the received key command (Step 14).

Subsequently, it is determined whether a continuous-key-press command is received or not (Step 15). If the continuous-key-press command is not received, it is determined whether 750 ms has elapsed from transmission of the latest ACK (Step 23). If 750 ms has not elapsed from transmission of the latest ACK, it is determined whether the continuous-key-press release command is received or not (Step 19). If the continuous-key-press release command is not received, the control flow returns to Step 15.

If a continuous-key-press command is received within 750 ms of transmission of the latest ACK ("YES" at Step 15), it is determined whether an address of a send-side device transmitted along with the continuous-key-press command coincides with the address stored at Step 13 (Step 16). If the addresses are not coincident with each other, the control flow returns to Step 15.

If it is determined at Step 16 that both the addresses coincide with each other, the receive-side device returns an ACK to the send-side device (Step 17). Then, the receive-side device performs a control operation (continuous-key-press control operation) based on the continuous press of the key corresponding to the received key command (Step 18).

Briefly, the continuous-key-press control operation is started when the control is transferred to Step 18 by the reception of the first continuous-key-press command sent from the send-side device subsequent to the key command. Further, the control operation is continued if the control is transferred to Step 18 by the reception of the second or subsequent continuous-key-press command.

The process at Step 18 is followed by Step 19 where it is determined whether a continuous-key-press release command is received or not. If it is determined at Step 19 that the continuous-key-press release command is not received, the control flow returns to Step 15.

Therefore, as long as the continuous-key-press command is transmitted within 750 ms, the continuous-key-press control operation is continued.

If the continuous-key-press release command is received within 750 ms of transmission of the latest ACK ("YES" at Step 19), it is determined whether or not an address of a send-side device accompanying the continuous-key-press release command coincides with the address stored at Step 13 (Step 20). If the two addresses are not coincident with each other, the control flow returns to Step 15.

If it is determined at Step 20 that both the addresses coincide with each other, the receive-side device returns an ACK to the send-side device (Step 21) and terminates the continuous-key-press control operation (Step 22). Thus, the present process is terminated.

If 750 ms has elapsed from transmission of the last ACK with no continuous-key-press command nor continuous-key-press release command transmitted to the receive-side device from the send-side device having the address stored at Step 13 ("YES" at Step 23), the device terminates the continuous-key-press control operation (Step 22). Thus, the present process is terminated.

The aforementioned embodiment of the invention allows the receive-side device to distinguish the single key press from the continuous key press and also prevents the bus congestion during the continuous key press.

The embodiment of the invention ensures normal control of a single surveillance camera even if the continuously operable keys on the two controllers 11, 12 are kept pressed in overlapping time relation.

Figure 4:
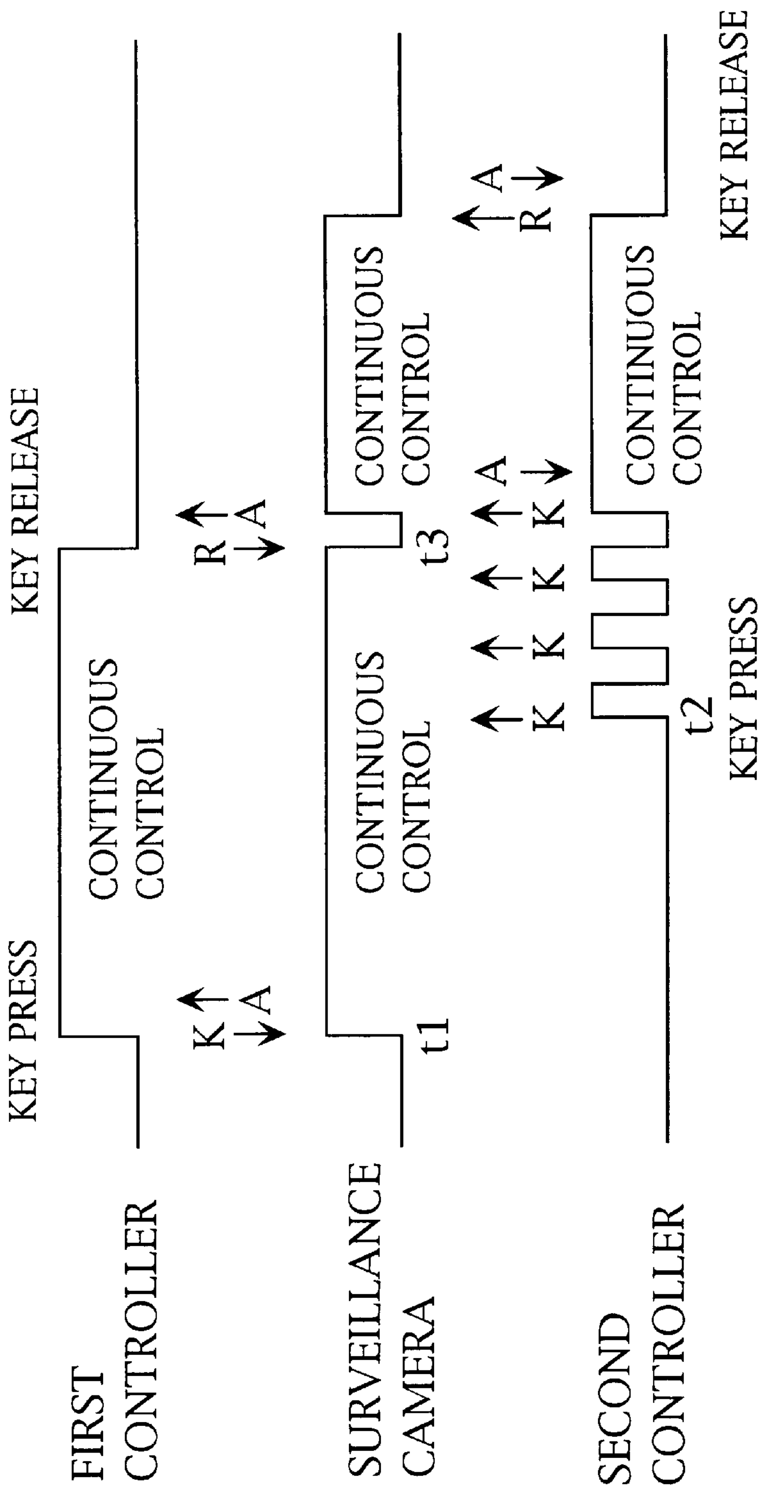
FIG. 4 is a time chart illustrating how a single surveillance camera operates when continuously operable keys on two controllers are pressed in overlapping time relation for controlling the surveillance camera.

Assume, as shown in FIG. 4 for example, that a control operation associated with a continuous press of ZOOM WIDE key on the first controller 11 is executed on a single surveillance camera 21, starting from a time point t1. In FIG. 4, the key command is represented by "K", ACK is represented by "A" and the continuous-key-press release command is represented by "R". Also assume that a continuous press of ZOOM TELE key on the second controller 12 is started at some time point t2 in the course of this continuous-key-press control operation, for controlling the surveillance camera 21.

At the time point t2, the surveillance camera 21 is performing the operation at Step 15 or its subsequent steps in FIG. 3, being unable to accept a key command sent thereto from the second controller 12. Hence, the surveillance camera 21 returns no ACK to the controller 12. In FIG. 2, the answer at Step 3 is "NO" so that the operation of the second controller 12 returns to Step 1. Accordingly, the second controller 12 keeps transmitting the key command repeatedly.

When receiving a continuous-key-press release command R from the first controller 11, the surveillance camera 21 returns an ACK to the first controller 11 and terminates the control operation associated with the continuous press of WIDE key.

If the surveillance camera 21 returns to the first controller 11 the ACK indicating the receipt of the continuous-key-press release command R from the first controller 11 and thereafter, a key command corresponding to ZOOM TELE key on the second controller 12 is transmitted to the surveillance camera 21, the surveillance camera 21 accepts this key command so that a continuous-key-press control operation associated with ZOOM TELE key is started from this point of time.

If the second controller 12 transmits the continuous-key-press command or continuous-key-press release command to the surveillance camera 21 which is performing the continuous-key-press control operation associated with ZOOM WIDE KEY on the first controller 11, Step 16 or 20 determines that the addresses do not coincide with each other and hence, such a command is nullified.

What is claimed is:

1. A remote control system comprising:

an electronic device; and a controller connected to the electronic device via a bus for remotely controlling the electronic device, the controller provided with keys including a continuously operable key to be kept pressed for causing the electronic device to perform a predetermined operation continuously, the controller having means responsive to a continuous press of the continuously operable key to transmit, to the electronic device, a key command indicative of a type of the pressed key, and means for transmitting a continuous-key-press command to the electronic device at first time intervals of a predetermined length while the key is kept pressed, the electronic device having means which determines the key of the type corresponding to the key command to be kept pressed if, after receipt of the key command, the continuous-key-press command is received at some time point between lapses of a first time period and a second time period, the second time period being longer than the first time period, and then triggers a continuous-key-press control operation associated with the continuous-key-press command, and means which determines at each receipt of the continuous-key-press command whether or not the next continuous-key-press command is transmitted within the second time period after receipt of the latest continuous-key-press command and instantly terminates the continuous-key-press control operation when the next continuous-key-press command is not transmitted within the second time period after receipt of the latest continuous-key-press command, p1 wherein the controller has means responsive to release of the continuously operable key thereby transmitting a release command indicative of the key release to the electronic device, and the determining means instantly terminates the continuous-key-press control operation when the release command in absence of the next continuous-key command is not transmitted within the second time period after receipt of the latest continuous-key-press command.

2. A remote control system as claimed in claim 1, wherein the electronic device has means responsive to the release command to instantly terminate the continuous-key-press control operation.

3. A remote control system as claimed in claim 1, wherein, with two or more controllers connected to the bus, the electronic device has means which, when the electronic device responds to a continuous-key-press command from one of the controllers to perform a continuous-key-press control operation, nullifies a key command or continuous-key-press command from (any of) the other controller(s).

4. A remote control system as claimed in claim 2, wherein, with two or more controllers connected to the bus, the electronic device has means which, when the electronic device responds to a continuous-key-press command from one of the controllers to perform a continuous-key-press control operation, nullifies a key command or continuous-key-press command from (any of) the other controller(s).

* * * * *